United States Patent [19]

Suzuki et al.

[11] 4,301,363

[45] Nov. 17, 1981

[54] ALIGNMENT DEVICE

[75] Inventors: Akiyoshi Suzuki, Tokyo; Ryozo Hiraga; Hideki Yoshinari, both of Yokohama, all of Japan

[73] Assignee: Canon Kabushiki Kaisha, Tokyo, Japan

[21] Appl. No.: 70,986

[22] Filed: Aug. 30, 1979

[30] Foreign Application Priority Data

Sep. 1, 1978 [JP] Japan ................. 53-107880

[51] Int. Cl.³ ........................................... G01N 21/86
[52] U.S. Cl. ..................................... 250/216; 250/548
[58] Field of Search ............... 250/216, 571, 572, 548, 250/557; 356/446, 399, 400, 401; 350/91

[56] References Cited

U.S. PATENT DOCUMENTS 3,989,385 11/1976 Dill et al. ............................ 356/152
4,167,677 9/1979 Suzki .................................. 250/548

Primary Examiner—David C. Nelms
Assistant Examiner—Darwin R. Hostetter
Attorney, Agent, or Firm—Fitzpatrick, Cella, Harper & Scinto

[57] ABSTRACT

An alignment device of a type, wherein an alignment pattern provided on a mask for fabrication of a semiconductor circuit element and an alignment pattern provided on a wafer are photoelectrically read in a dark field by a flying spot scanning system or a flying image scanning system to detect a relative positional relationship between the mask and the wafer, and a desired positional relationship is obtained by moving at least one of the mask and wafer on the basis of a detected signal. The novel feature of this alignment device resides in that the size of a line forming the alignment pattern along the scanning line is twice or more as large as the size of the scanning spot.

4 Claims, 14 Drawing Figures

ALIGNMENT DEVICE

BACKGROUND OF THE INVENTION

1. Field of the Invention

This invention relates to a device for aligning a mask and a wafer for use in a printing device for fabricating a semiconductor circuit element.

2. Description of the Prior Arts

There has already been proposed in Japanese patent application Nos. 51-49109 and 52-50605 by the assignee-to-be of the present application a device for effecting alignment between a mask and a wafer, wherein alignment marks on the mask and wafer are scanned along a scanning line with a scanning unit of a predetermined magnitude, and light from these alignment marks are photoelectrically detected to find out a quantity of displacement between the mask and the wafer. By the term "scanning unit", it is meant as follows: there exist various scanning systems such as "flying spot system", "flying image system", "a system, wherein an image of a scanning object is formed on a light receiving surface of an image pick-up tube, a photo-array, etc.", and others, all of which systems perform the sequential scanning of a region having a predetermined size along the scanning line, when it is viewed on such scanning line. Such region is called the scanning unit. More concretely, the region corresponds to a size of a scanning spot on the scanning surface in the flying spot system, to a size when the light receiving surface of a fixed light receiving device is projected on the scanning surface in the flying image system, and to a size when a photo-detector is projected on the scanning surface in the photo-array system.

For the better understanding of the art, explanations will be given in the following in reference to FIG. 1 as to the alignment device of the abovementioned earlier applications, wherein the flying spot system is adopted.

A laser beam scanning optical system as illustrated in this figure of drawing comprises a laser beam source 1, a beam collecting lens 2, a rotatory polygonal mirror 3, a relay lens 4, a beam splitter 5 for leading light into optical systems 22-24 for eye sight observation, a field lens 6, beam splitter 7 for leading light into photoelectric detecting system 14-18, a relay lens 8, a beam splitter 9 for leading light from illuminating optical system 19-21 for eye sight observation, an object lens 10, a pupil 11, a mask 12, and a wafer 13. Incidentally, it is to be noted that the system for transferring the mask image onto the wafer according to the device shown in FIG. 1 is on the premises of the contact printing method or the proximity printing method, and that, in the case of the image projection method using lenses and mirrors, an image forming optical system is interposed between the mask and the wafer. For example, now suppose that the arrangement of this image forming optical system is the telecentric arrangement, the wafer 13 in FIG. 1 may be considered as an image of the wafer. In the scanning optical system in FIG. 1, the image forming relationship of the scanning spot is as follows. A reference numeral 34 designates a scanning spot. Now tracing the light travelling path from this scanning spot 34 back to the rotatory polygonal mirror 3, the spot is once focussed at a point 32 in the vicinity of the field lens 6 through the object lens 11 and the relay lens 8, and is again focussed at a point 30 through the relay lens 4 after it is reflected by the rotatory polygonal mirror 3. In other words, the positions 30, 32 and 34 are mutually in a conjugative relationship. Accordingly, if a spot diameter of the laser beam at the point 30 is $\phi$, and an image forming magnification from the point 30 to the point 34 is $\beta$, the diameter of the scanning spot at the point 34 is denoted by $\beta\phi$.

Besides the above-explained conjugative relationship of the scanning beam on the surface of the acutal object, the image forming relationship of the pupil 10 in the optical system shown in FIG. 1 is also important. That is, a point 33 on the optical axis which is the center of the pupil 10 of the object lens 11 is conjugative with a reflecting point 31 on the rotatory polygonal mirror 3. In more detail, from the standpoint of incidence of the laser beam into the object lens, the arrangement in FIG. 1 can be said to be just equivalent to a case where the rotatory polygonal mirror is placed at the position of the pupil 10.

For understanding of the optical system in FIG. 1, the function of the object lens 11 should be well understood. FIG. 2 is a diagram showing the principle of the function of the object lens 11, wherein it is in the telecentric arrangement. By the telecentric object lens, it is meant that the position of the pupil 10 which is the place for determining the size of the light beam passing through the object lens is coincident with the front focal point thereof. Light rays passing through the center of the pupil is called the principal light rays, because they constitute the central light rays in the light beam. The center of the pupil stands for the focal point of the object lens, hence the principal light rays, after passage through the object lens, become parallel with the optical axis of the object lens, and vertically impinge on the object surfaces 12, 13. When the vertically projecting light rays impinge on the portion of the object where the mirror surface reflection is effected, they are reflected and go back to the path, through which they have come, and, after passage through the object lens 11, they return again to the center 33 of the pupil 10. On the other hand, if it is assumed that a pattern is present at a lighted portion, the light is subjected to scattering at a portion of a boundary line constituting the pattern. Now, if this portion of the boundary line is generally designated as the "edge", the light scattered at this edge portion, unlike the case of the mirror surface reflection, does not trace the original path, through which it came. Accordingly, the scattered light no longer passes through the center of the pupil when it is again captured by the object lens 11 and passed through the pupil 10. This fact reveals that, when the reflected light which has passed through the object lens is observed on the pupil, the mirror surface reflected component and the scattered light component are spatially reparated in the pupil. FIG. 2 shows this separated state. In the drawing, the light beam of the mirror surface reflected component which enters into the pupil, and passes through the object lens and the pupil again is shown as a diagonally hatched area, while the scattered light component which can be captured by the object lens is shown as a dotted area. It is common that the diameter of the light beam effective for this mirror surface reflected portion is sufficiently smaller than the diameter of the pupil for effectively capturing the scattered light. Usually, the ratio of the diameter should desirably be within a range of 0.1 to 0.7 or in that vicinity.

Reverting to FIG. 1, let us now consider the photoelectric detecting optical system which deviates from the beam splitter 7 and reaches the photo-detector 18. In the drawing, a numeral 14 refers to a lens for focusing the pupil 10 of the object lens 11, and a reference numeral 15 designates a filter which causes light for the photoelectric detection to pass therethrough and which substantially intercepts lights in other wavelength such as, for example, light in a wavelength region to be used for the eye sight optical system. A position 16 designates a place where an image of the pupil 10 is formed by a lens 14 for focusing the pupil. At this position, there is provided a light intercepting plate 16 which permits the scattered light alone to pass, and blocks the non-scattered light. The scattered light which has passed through the light intercepting plate 16 is converged on a photodetector 18 by means of a condenser lens 17. Accordingly, the pupil 10, the light intercepting plate 16, and the photo-detector 18 are in a mutually conjugative relationship. The light intercepting plate can be readily fabricated by patterning on a transparent glass substrate using a substance such as metal or carbon. The photoelectric detection system which detects the scattered light, therefore, produces an output only when the scanning spot is about to reach the edge portion of the pattern. If it is assumed that the pattern constitutes the alignment mark shown on each of the mask and the wafer, a relative positional displacement between the mask and the wafer can be detected from the output signal. Accordingly, the relative positional displacement between them is corrected by a drive system comprising an operational circuit 26 and a moving and adjusting mechanism 27, in accordance with the quantity of displacement as detected. Thus an automatic alignment can be effected.

Besides the abovementioned systems in the alignment device of FIG. 1, there are further provided therein an illuminating system for eye sight consisting of components 19, 20 and 21, and an observation system consisting of components 22, 23 and 24. More specifically, the illuminating system comprises a light source 19, a condenser lens 20 which functions to perform the so-called Koehler illumination, by which the light source image is formed on the pupil 10 of the object lens 11, and a filter 21 which causes wavelengths in a non-photosensitive region of the photoresist coated on the wafer 13 to transmit therethrough. In some case, the filter 21 is required to suppress the light transmission factor of the light in the wavelength region for the photoelectric detection in order not to send out excessive light to the photoelectric detecting system. Selection of the filter 21 meeting such purpose may be properly done in conjunction with the filter 15. The observation system comprises an erector 22 which erects an image, a photoelectric detection system 23, more specifically, a filter to attenuate the scanning laser light, and ocular lenses 24.

For an alignment mark suited for such device, reference may be had to Japanese patent application No. 52-5502, for "Optical Device", filed Jan. 21, 1977 by the assignee-to-be of the present application.

FIG. 3 shows an alignment mark MM of the mask, an alignment mark WM of the wafer, and a scanning line S for detecting signals from them. SP designates a scanning spot. The scanning line is formed by movement of a laser spot light focused on the object surface to be scanned by the optical system of FIG. 1, i.e., on the mask 12 and the wafer 13, in accordance with rotation of the rotatory polygonal mirror 3. An angle which the scanning line forms with the alignment marks is 45°. When these marks are used, the displacements in both x and y directions can be detected with a uni-directional scanning. In case the wafer displaces by $\Delta x$ and $\Delta y$ with respect to the mask provided that the space intervals among them are taken as $w_1$, $w_2$, $w_3$, $w_4$ and $w_5$ as in FIG. 3, the quantity of the displacement can be easily found out from the following equation.

$$\Delta x = \{(w_1 - w_2) + (w_4 - w_5)\}/4$$
$$\Delta y = \{-(w_1 - w_2) + (w_4 - w_5)\}/4 \tag{1}$$

The actual photoelectric outputs will become those as shown in the lower part of FIG. 3, wherein six signals are emitted from the edge portions of the marks, hence the displaced quantity can be obtained by processing these signals. When the speed of the scanning spot is v, and the pulse intervals are $t_1$ to $t_5$, the following equation is derived.

$$\Delta x = \{(t_1 - t_2) + (t_4 - t_5)\} \cdot v/4$$

$$\Delta y = \{-(t_1 - t_2) + (t_4 - t_5)\} \cdot v/4$$

However, in the case of the mark as in the aforementioned earlier application, there exist several problems, the most important of which is a relationship between a width of the pattern line and a diameter of the scanning spot.

In the explanation of the principle of the alignment mark shown in FIG. 3, a state of pulse generation at a place where the spot impinges on the mark line has been shown. However, the mark cannot be a mathematical line, and, in the case of a finite line as shown in FIG. 3, it has a width of an order same as the diameter of the scanning spot, which complicates the situation. In other words, according to the example of the output as shown in the lower part of FIG. 3, it is so drawn that a single pulse is emitted from each mark portion. In reality, however, this output is a composite waveform of two pulses from two edges constituting the lines of the mark. When the width of the lines of a mark is made sufficiently broader than the scanning spot in practice, the outputs from the two edges are separated, whereby it becomes possible to readily observe that the waveform which has so far appeared to be a single pulse is a synthesis of two waveforms.

As mentioned in the foregoing, the signal processing is done by measuring the pulse interval. When the method of the pulse generation as shown in FIG. 3, i.e., the method, wherein a single pulse is obtained as the result of synthesis of two pulses from two edges, is adopted, a balance between these two pulses becomes problematical. That is, when the output of one of the pulses is stronger than the other, a distortion occurs in the composite waveform and no accurate measurement can be done. In particular, the output from the mark on the wafer tends to be distorted, because, after the wafer has undergone various process steps, the shape of the two edges differs, owing to which the balance between the two pulses is broken. This has been the problem from the standpoint of precision in measurement.

SUMMARY OF THE INVENTION

In view of the foregoing, it is an object of the present invention to provide an alignment device having high precision in measurement.

The present invention has paid attention to the fact that a pulse, which has heretofore been photoelectrically detected, can be precisely resolved into two pulses has adversely affected the measuring precision, based on which finding it has constructed the alignment mark in such a manner that each pulse may be constituted with a signal from a single edge portion. In other words, the feature of the present invention resides in that the alignment mark is formed with a line having a width twice or more as thick as the diameter of the scanning spot. Incidentally, formation of the alignment mark with the line width twice or more as thick as the diameter of the scanning spot is taught in U.S. Pat. No. 3,497,705. However, the device as taught in this U.S. Patent does not perform the dark field photoelectric detection. Therefore, while the patented invention appears to be similar to the present invention in the relationship between the alignment mark and the scanning spot, it is essentially irrelevant to the present invention.

DESCRIPTION OF THE PREFERRED EMBODIMENTS

Figure 1:
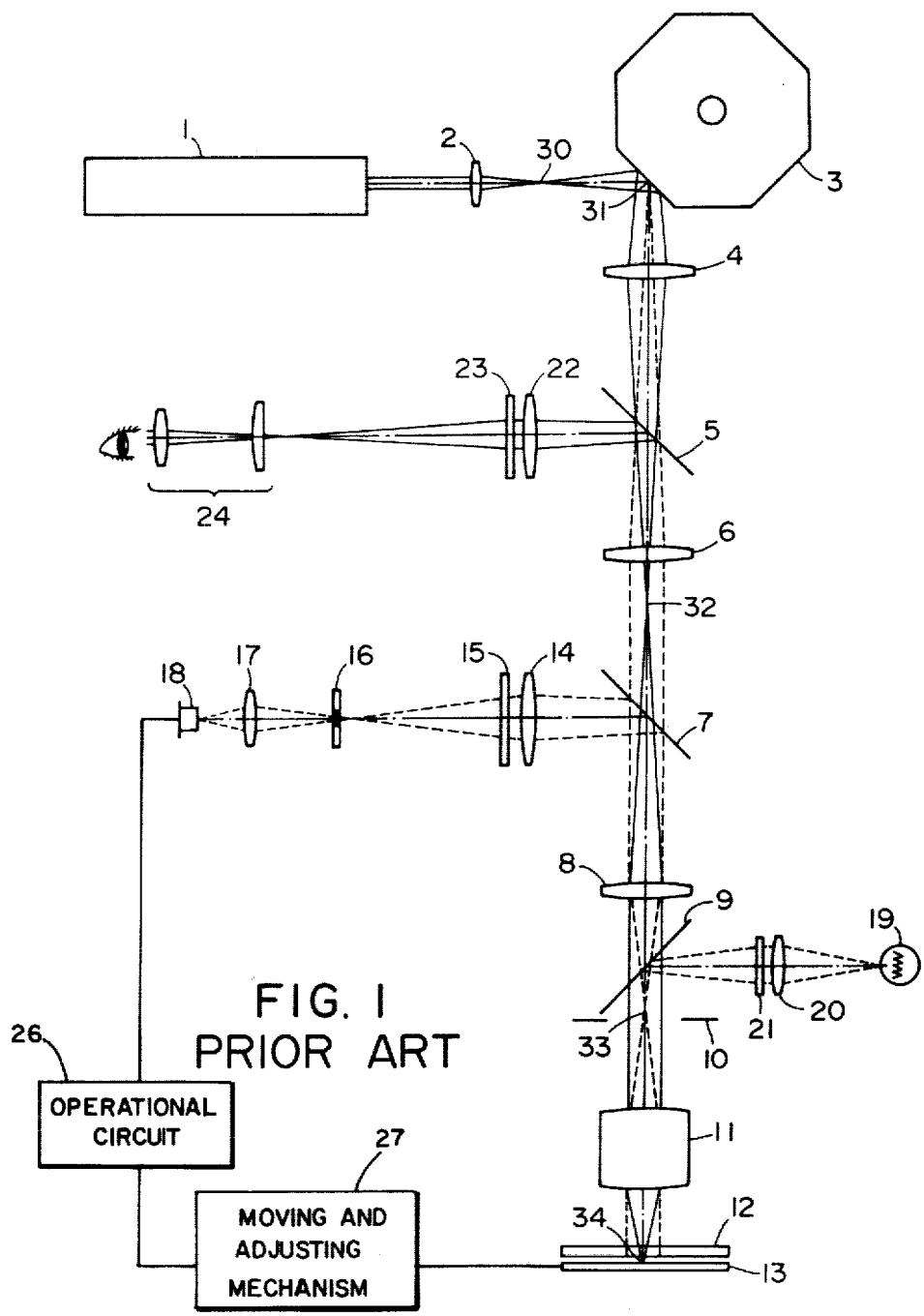
FIGS. 1, 2 and 3 are explanatory diagrams for the conventional alignment device.
Figure 2:
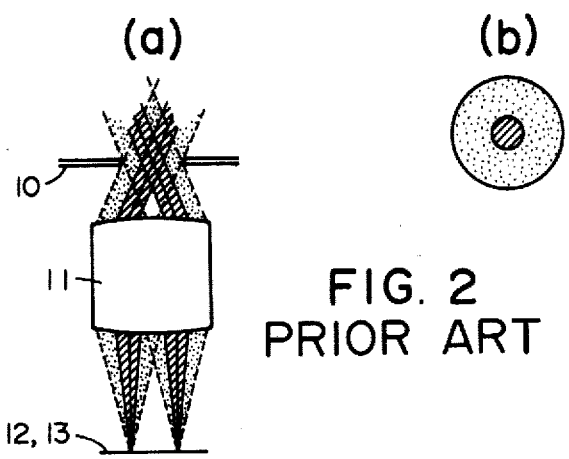
Figure 3:
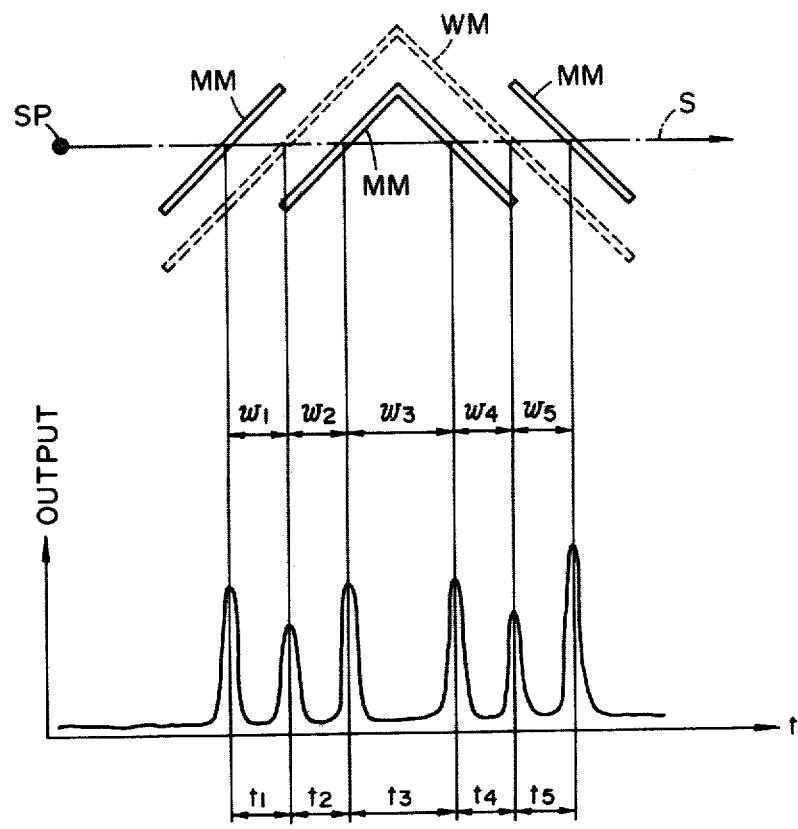
Figure 4:
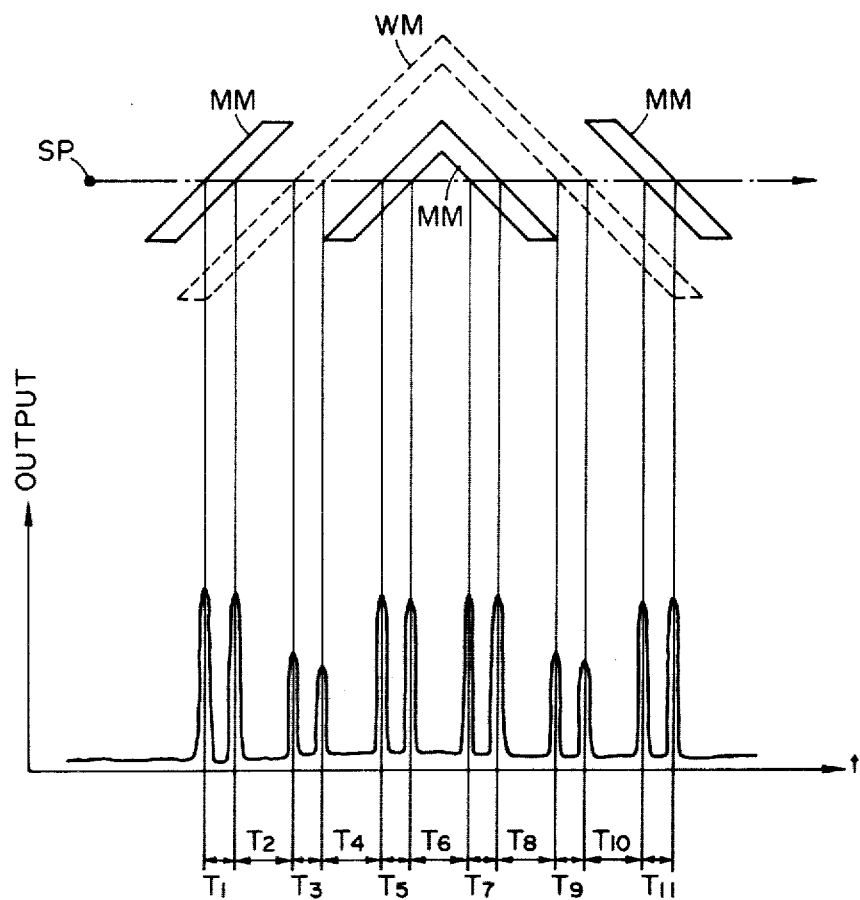
FIG. 4 is a diagram showing the alignment mark to be adopted in the alignment device of the present invention, and photoelectric output thereof.

FIG. 4 shows one embodiment of the present invention. Same as in the case of FIG. 3, the solid line represents the mask pattern MM, the broken line the wafer pattern WM, and the dot-and-dash line the signal detecting line S which the spot light scans. In this embodiment, the line width in the scanning direction of the mask and wafer patterns in FIG. 3 is made twice or more as broad as that of the scanning spot SP in its scanning direction so that the output from the scanning spot on each edge may be perfectly separated. Observed in this embodiment are twelve pulse trains with eleven pulse intervals. If they are placed in the following equation, the quantity of displacement can be calculated by the equation (2), because the intersecting angle between the pattern and the scanning line is 45°.

$$t_1 = T_2 + (T_1 + T_3)/2$$

$$t_2 = T_4 + (T_3 + T_5)/2$$

$$t_4 = T_3 + (T_7 + T_9)/2$$

$$t_5 = T_{10} + (T_9 + T_{11})/2 \tag{3}$$

The line width of the wafer may be made sufficiently broad so that the output pulses from the two edges may not overlap even if the processing is overlapped. In this embodiment, the mask pattern and the wafer pattern may be safely interchanged. In this case, it goes without saying that the quantity of displacement to be calculated from the equation (2) becomes reverse in its symbol.

Figure 5:
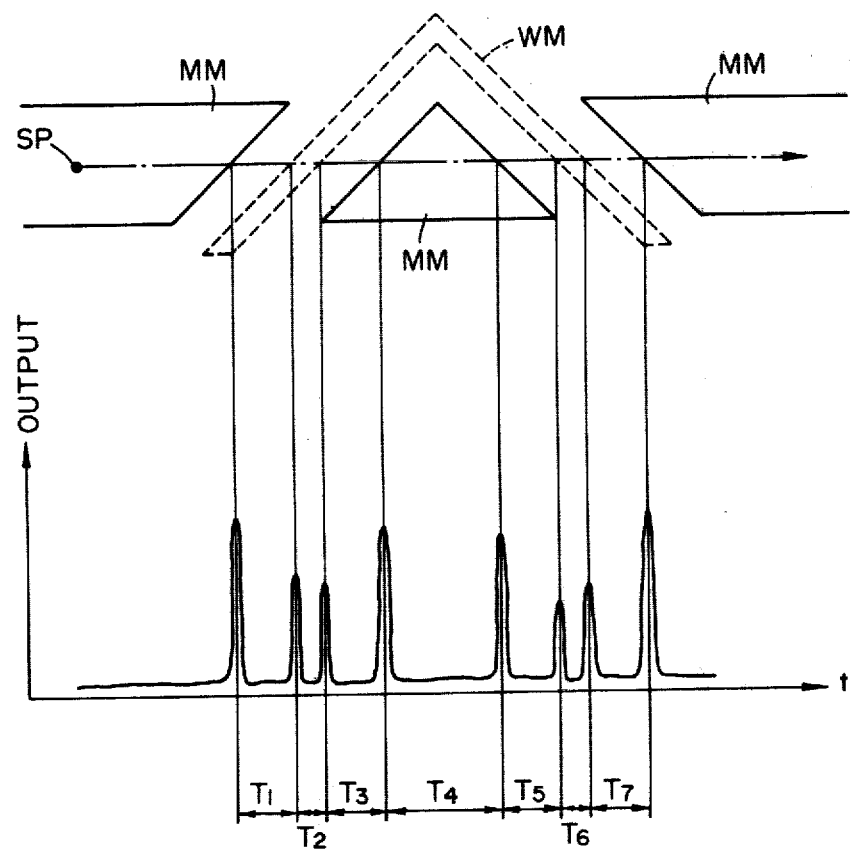
FIGS. 5 through 10 inclusive are respectively alignment marks of different construction and the photoelectric outputs thereof.

FIG. 5 shows the second embodiment of the present invention, in which the line width of the alignment marks MM and WM are twice or more as large as the diameter of the scanning spot. While, in the embodiment of FIG. 4, the number of pulses to be processed has increased from six in the conventional system to twelve which is twice as many as the conventional. In this embodiment, however, the processing can be done with eight pulses which is an increase by two from the conventional system. If conversion is done as follows, the quantity of displacement can be calculated from the equation (2), because the intersecting angle between the pattern and the scanning line is 45°.

$$\left.\begin{aligned} t_1 &= T_1 + \frac{T_2}{2} \\ t_2 &= T_3 + \frac{T_2}{2} \\ t_4 &= T_5 + \frac{T_6}{2} \\ t_5 &= T_7 + \frac{T_6}{2} \end{aligned}\right\} \tag{4}$$

The condition for the line width of the wafer pattern is the same as that of the embodiment in FIG. 4. That is, the line width may be designed sufficiently broad as to not causing overlap between the output pulses from the two edges even if the process steps are overlapped.

Figure 6:
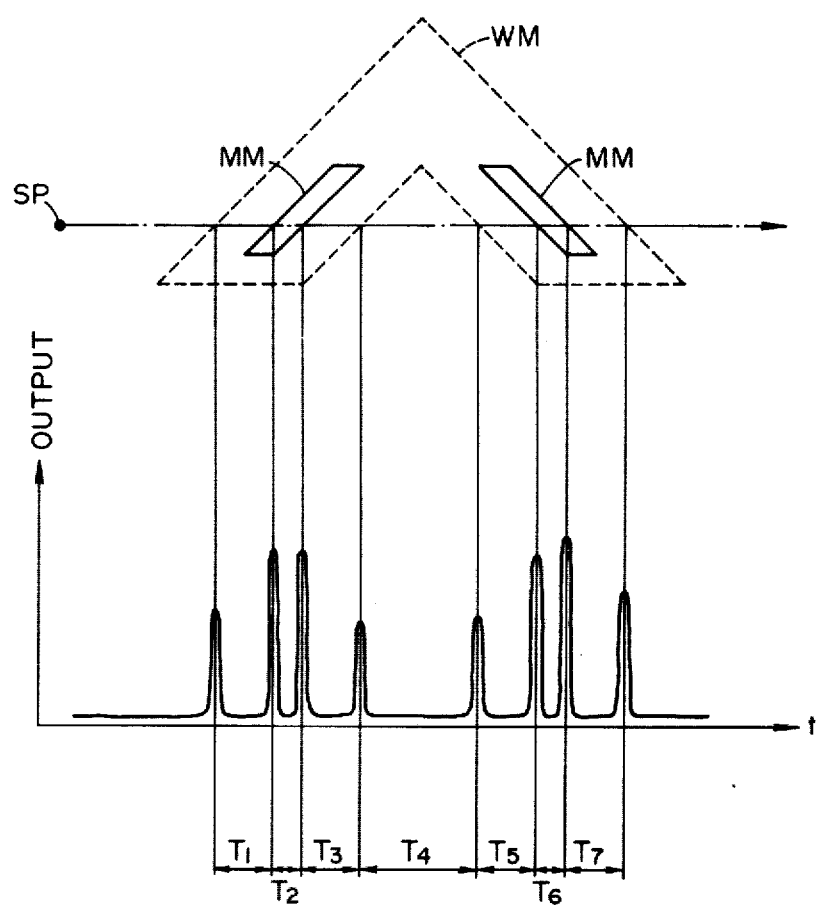

FIG. 6 is the reverse of the positional relationship between the mask and the wafer, in which the signal processing can also be done with eight pulses.

If the timing relationship is represented as in the following equation (5), the quantity of displacement of $\Delta x$ and $\Delta y$ can be represented as in equation (6).

$$\left.\begin{aligned} t_1' &= T_1 + \frac{T_2}{2} \\ t_2' &= T_2 + \frac{T_2}{2} \\ t_4' &= T_5 + \frac{T_6}{2} \\ t_5' &= T_7 + \frac{T_6}{2} \end{aligned}\right\} \tag{5}$$

$$\Delta x = \{-(t_1' - t_2') - (t_4' - t_5')\} \cdot v/4 \tag{6}$$

$$\Delta y = \{-(t_1' - t_2') - (t_4' - t_5')\} \cdot v/4$$

Figure 7:
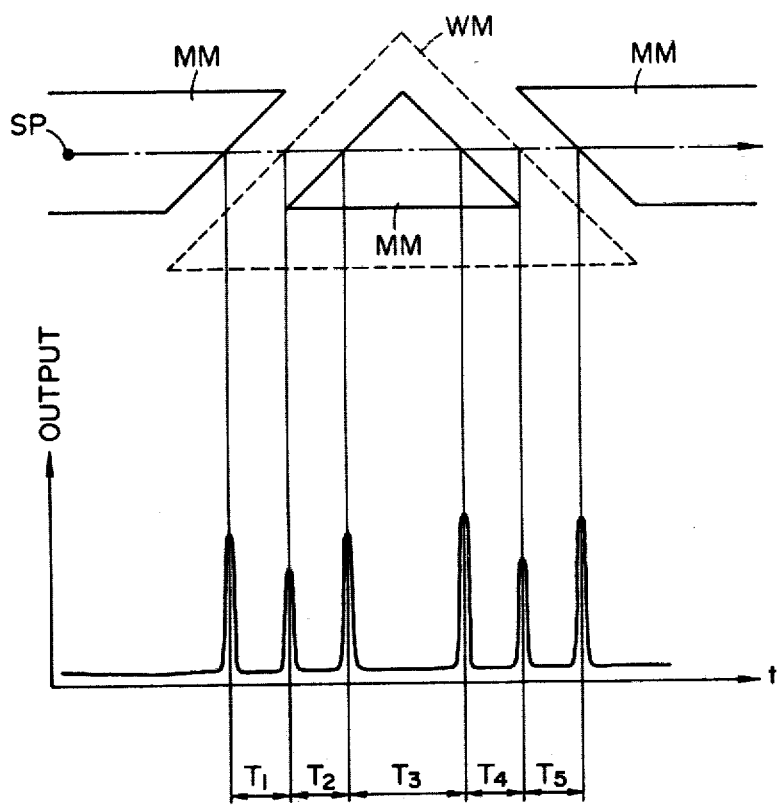

FIG. 7 illustrates the fourth embodiment of the present invention, according to which the quantity of displacement can be detected with six signals, i.e., with the same number of pulses as in the conventional method. Here, in this embodiment, the wafer pattern is in a triangular insular form. Calculation of the quantity of displacement can be done by substituting the following values for the equation (2), hence the signal processing can be done in the exactly same manner as in the conventional method.

$$t_1 = T_1, \ t_2 = T_2, \ t_4 = T_4, \ t_5 = T_5$$

Thus, by changing the system of capturing the scattered light from the edge portion into the system of corresponding a signal from one edge to one pulse output, it becomes possible to improve precision in measurement against the conventional system.

A modification of the concept of the present invention can be applied to the mask. That is, since the mask pattern of the alignment mark plays no role at all in the function of the element, there is no necessity for it to be transferred onto the wafer, hence it can be safely formed thinner than the actual element, without trouble. Conversely, the mask pattern can be regarded as being approximate to the mathematical line by thinning the same. This concept is not applicable to the pattern at the wafer side. Therefore, the same purpose can be attained even by sufficiently thinning the pattern at the side of the mask in comparison with the diameter of the scanning spot, i.e., at least less than a time, or below a single multiplication, and by thickening the wafer pattern.

Figure 8:
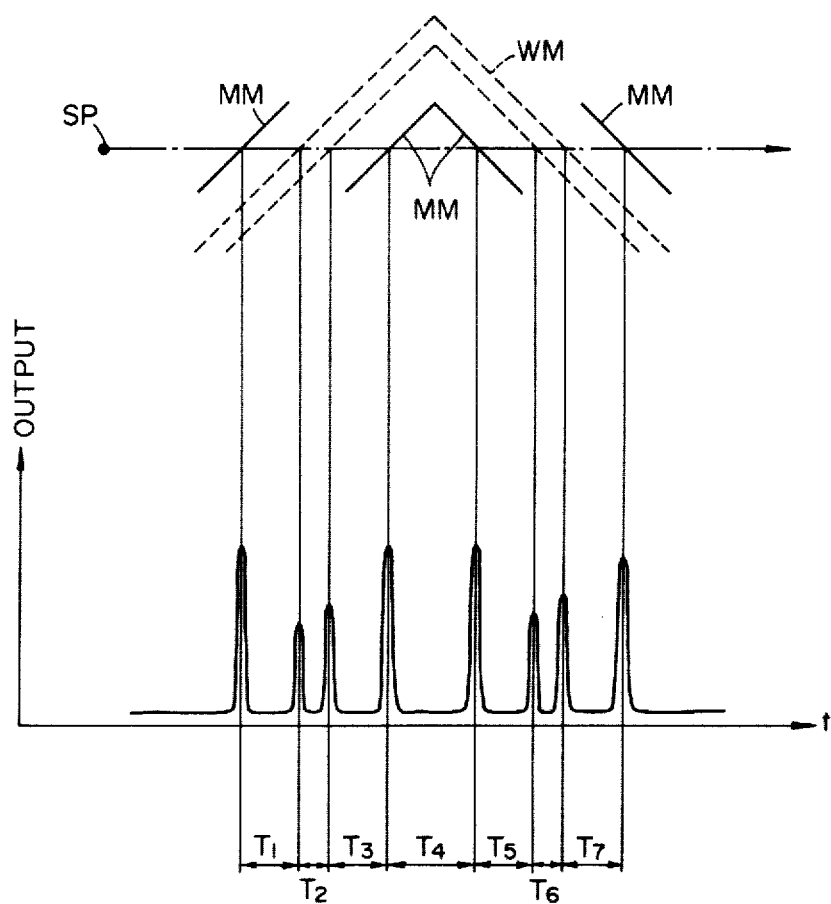
Figure 9:
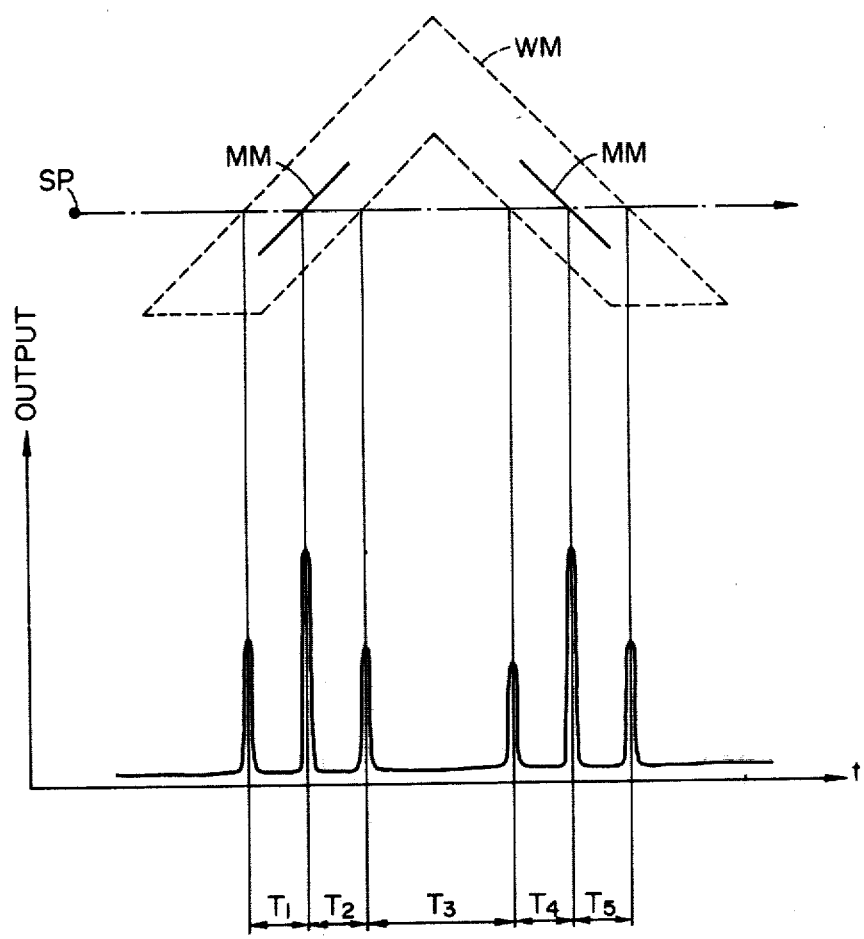
Figure 10:
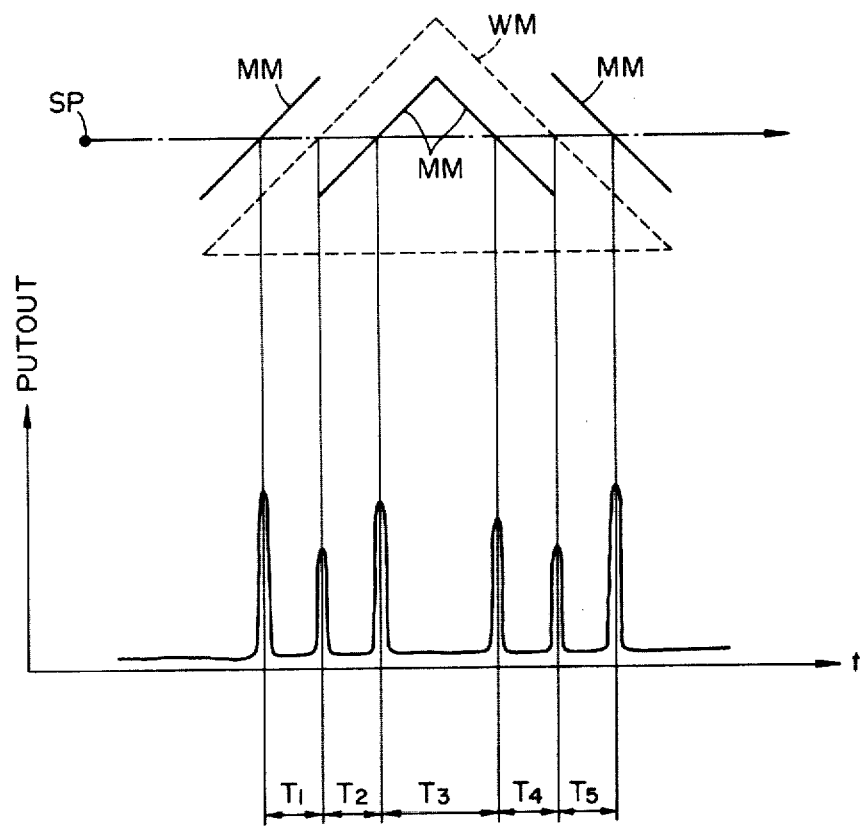

The embodiment shown in FIG. 8 is a modification of the embodiment in FIG. 5, the embodiment in FIG. 9 is a modification of that in FIG. 6, and the embodiment in FIG. 10 is a modification of that in FIG. 7. The calculating equations are also corresponding among them, hence detailed explanations will be dispensed with.

For the optical system in the present embodiments, laser is used as the light source, and the scanning light is constituted with a laser spot. Illumination of the surface of a scanning object with a large light quantity and constriction of the scanning light to a small spot diameter to obtain high precision are very difficult with an ordinary light source. From this point of view, the laser light has high luminosity and good directivity, so that it can prefectly meet the abovementioned requirements. The technique of carrying out the spot scanning on the surface of an object, therefore, has first become an extremely effective expedient by the use of the laser as in the present invention.

Figure 11:
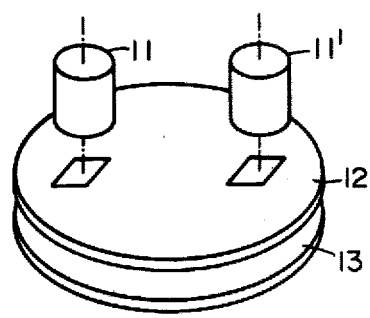
FIG. 11 is a perspective view showing an object lens portion.
Figure 12:
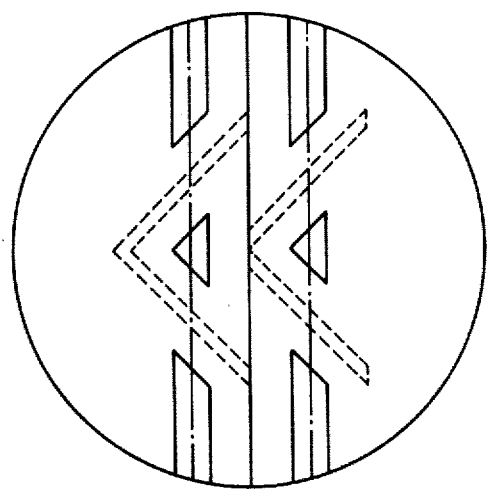
FIGS. 12 and 13 respectively indicate the alignment mark images formed by the object lens in FIG. 8.
Figure 13:
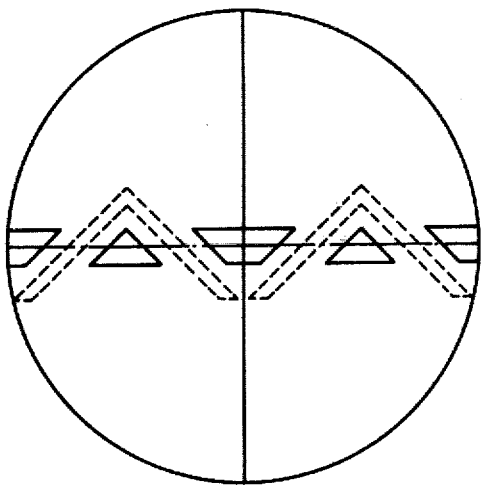

In the afore-described embodiments, the parallel displaced components in the x and y directions of the mask and wafer have been detected. For the positioning of the two-dimensional objects such as the actual mask and wafer, however, a rotational component $\theta$ should also be detected besides these parallel displaced components. In order to detect the rotational component, the displacement between the mask and wafer may be detected at a plurality of locations, for example. FIG. 11 indicates this state, wherein two different locations on the mask 12 are observed with object lenses 11, 11'. At these positions, there are disposed the abovementioned alignment marks according to the present invention. Although not shown in the drawing, there are also disposed alignment marks at the corresponding locations on the wafer 13. FIGS. 12 and 13 respectively show patterns formed by composing half sight of the object lens 11 and half sight of the object lens 11', when the mask and the wafer are observed. Such method of observation is called "split-field".

Figure 14:
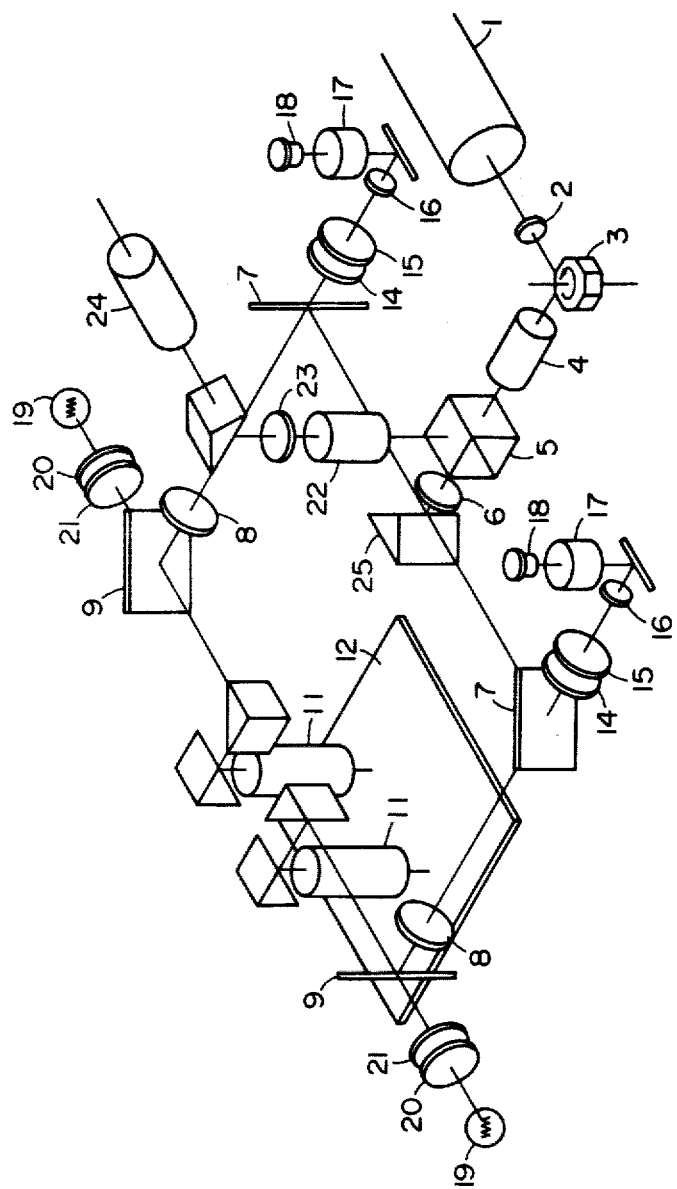
FIG. 14 is an optical layout of the alignment device according to the present invention.

FIG. 12 shows a case, wherein the scanning line in the dot-and-dash line is set in parallel with the field dividing line, and wherein the mark shown in FIGS. 4 to 9 is disposed in such a manner that it may get in touch with the scanning line. In this embodiment, the example of FIG. 4 is shown as representative. FIG. 13 shows a case, wherein the scanning line 13 orthogonally intersects with the field dividing line. However, in the example of FIG. 12, since the direction of the mark is shifted by 90° with respect to the mark as explained in reference to FIGS. 4 to 9, the calculating equation therefor will be somewhat different in symbols from those in the equations (2) and (6). One side of the divided field is called "right field", while the other side is called "left field". In this case, there are various methods as to how to scan the left and right fields. In the instance of FIG. 12, the simplest method is to produce a plurality of beams and to distribute them to both left and right fields. Such plurality of beams can be easily produced by use of a plurality of light sources or a beam dividing element such as, for example, a beam splitter or a crystal as a single light source. Another method is to scan the left and right fields on a time-division basis. In this case, the single light source may be used, and there is no necessity for splitting the beam. In the case of FIG. 13, the most preferable system is to distribute the light from the single light source to both left and right on a time-division basis, i.e., the left and right fields are scanned alternately. This system can be readily realized by scanning the light from the optical system are the left and right fields have been overlapped. This situation is shown in detail in FIG. 14.

In the above-described manner, the example shown in FIG. 11 measures two locations on the mask and the wafer to find out displacements in both x and y directions of the wafer with respect to the mask. When these displaced quantities are represented by $\Delta x$ right, $\Delta x$ left, $\Delta y$ right and $\Delta y$ left, and a distance between the two marks is represented by 2R, the displaced quantities $\Delta x$, $\Delta y$, and $\Delta \theta$ of the wafer with respect to the mask, as a whole, can be represented as follows.

$$\Delta x = \frac{\Delta x \text{ right} + \Delta x \text{ left}}{2}$$

$$\Delta y = \frac{\Delta y \text{ right} + \Delta y \text{ left}}{2}$$

$$\Delta \theta = \tan^{-1} \frac{\Delta y \text{ right} - \Delta y \text{ left}}{R}$$

Accordingly, by correcting these quantities of displacements by a driving system (not shown in FIG. 14) so as to correct the values, the desired alignment can be completed.

What we claim is:

1. An alignment device, comprising:
   (a) a mask supporting member to support a mask;
   (b) a wafer supporting member to support a wafer;
   (c) a moving and adjusting mechanism to move at least one of said mask and wafer;
   (d) a photoelectric detector which scans said mask and wafer with a scanning unit of a predetermined magnitude along a linear scanning line, and which reads alignment marks on said mask and wafer in a dark field;
   (e) a mask supported on said mask supporting member;
   (f) a wafer supported on said wafer supporting member, and having an alignment mark the size of which in the scanning direction is twice or more as large as the size of said scanning unit in the scanning direction; and
   (g) operational circuit means which operates an output signal from said photoelectric detector, and actuates said moving and adjusting mechanism when said mask and wafer are not in a predetermined relationship.

2. The alignment device as set forth in claim 1, wherein the size of the alignment mark of said mask in the direction of the scanning line is twice or more as large as that of said scanning unit in the scanning direction.

3. The alignment device as set forth in claim 1, wherein the size of the alignment mark of said mask in the direction of the scanning line is below a single multiplication in comparison with that of said scanning unit in the scanning direction.

4. The alignment device as set forth in claim 1, wherein one of said alignment marks is constructed with a line which intersects with the scanning line at two kinds of angles, and the other alignment mark is constructed with a line which is parallel with the line of said one alignment mark in its aligned state and intersects with said scanning line at two kinds of angles.

* * * * *